(12) United States Patent
Kojovic

(10) Patent No.: US 7,902,812 B2
(45) Date of Patent: Mar. 8, 2011

(54) ROGOWSKI COIL ASSEMBLY AND METHODS

(75) Inventor: Ljubomir A. Kojovic, Racine, WI (US)

(73) Assignee: Cooper Technologies Company, Houston, TX (US)

(*) Notice: Subject to any disclaimer, the term of this patent is extended or adjusted under 35 U.S.C. 154(b) by 0 days.

(21) Appl. No.: 12/476,501

(22) Filed: Jun. 2, 2009

(65) Prior Publication Data
US 2009/0230948 A1  Sep. 17, 2009

Related U.S. Application Data

(63) Continuation of application No. 11/593,239, filed on Nov. 6, 2006, now Pat. No. 7,564,233.

(51) Int. Cl.
*G01R 15/20* (2006.01)
(52) U.S. Cl. ..................................................... 324/117 R
(58) Field of Classification Search .................. None
See application file for complete search history.

(56) References Cited

U.S. PATENT DOCUMENTS

| | | |
|---|---|---|
| 4,039,930 A | 8/1977 | Lukas |
| 4,063,166 A | 12/1977 | Glavitsch |
| 4,446,420 A | 5/1984 | Dronet |
| 4,449,417 A | 5/1984 | Sasaki |
| 4,570,231 A | 2/1986 | Bunch |
| 4,623,949 A | 11/1986 | Salowe et al. |
| 4,709,205 A | 11/1987 | Baurand et al. |
| 4,709,339 A | 11/1987 | Fernandes |
| 4,749,940 A | 6/1988 | Bullock |
| 4,766,549 A | 8/1988 | Schweitzer et al. |
| 4,933,630 A | 6/1990 | Dupraz |
| 4,939,449 A | 7/1990 | Cattaneo et al. |
| 5,115,447 A | 5/1992 | Bowman |
| 5,128,611 A | 7/1992 | Konrad |
| 5,414,400 A | 5/1995 | Gris et al. |
| 5,434,509 A | 7/1995 | Blades |
| 5,442,280 A | 8/1995 | Baudart |
| 5,461,309 A | 10/1995 | Baudart |
| 5,608,327 A | 3/1997 | Jones et al. |
| 5,825,189 A | 10/1998 | Johns |
| 5,852,395 A | 12/1998 | Bosco et al. |

(Continued)

FOREIGN PATENT DOCUMENTS

EP  0 494 720  6/1974

(Continued)

OTHER PUBLICATIONS

Ljubomir Kojovic, "PCB Rogowski Coils Benefit Relay Protection", Jul. 2002, IEEE, pp. 1-4.*

(Continued)

*Primary Examiner* — Jermele M Hollington
(74) *Attorney, Agent, or Firm* — King & Spalding LLP

(57) ABSTRACT

A Rogowski coil assembly includes a first Rogowski coil that surrounds a conductor and generates a first voltage output signal. A second Rogowski coil also surrounds the conductor. The second Rogowski coil generates a second voltage output signal. A relay device communicates with the first and second Rogowski coils and processes the first and second voltage output signals. For example, the relay device can process the voltage output signals to calculate an amount of noise in the first and second output voltage signals and/or to minimize the amount of noise in the first and second output voltage signals.

20 Claims, 11 Drawing Sheets

U.S. PATENT DOCUMENTS

| | | | |
|---|---|---|---|
| 5,903,155 A | 5/1999 | Bjorklund | |
| 6,313,623 B1* | 11/2001 | Kojovic et al. | 324/127 |
| 6,397,156 B1 | 5/2002 | Bachmann et al. | |
| 6,544,314 B2 | 4/2003 | Stendera et al. | |
| 6,597,180 B1 | 7/2003 | Takaoka et al. | |
| 6,624,624 B1 | 9/2003 | Karrer et al. | |
| 6,680,608 B2 | 1/2004 | Kojovic | |
| 6,713,998 B2 | 3/2004 | Stanimirov et al. | |
| 6,781,361 B2 | 8/2004 | Nestler | |
| 6,782,329 B2 | 8/2004 | Scott | |
| 6,810,069 B2 | 10/2004 | Kojovic et al. | |
| 6,822,457 B2 | 11/2004 | Borchert et al. | |
| 6,844,737 B2 | 1/2005 | Leprettre et al. | |
| 6,940,702 B2 | 9/2005 | Kojovic et al. | |
| 6,954,704 B2 | 10/2005 | Minami et al. | |
| 7,180,717 B2 | 2/2007 | Kojovic et al. | |
| 7,227,347 B2 | 6/2007 | Viaro et al. | |
| 7,415,368 B2* | 8/2008 | Gilbert et al. | 324/500 |
| 7,535,233 B2* | 5/2009 | Kojovic et al. | 324/512 |
| 7,538,541 B2* | 5/2009 | Kojovic | 324/127 |
| 7,564,233 B2* | 7/2009 | Kojovic | 324/117 R |
| 7,638,999 B2* | 12/2009 | Kojovic et al. | 324/127 |
| 2001/0029433 A1 | 10/2001 | Scott | |
| 2002/0125877 A1 | 9/2002 | Cooke | |
| 2003/0112569 A1 | 6/2003 | Kato et al. | |
| 2004/0012901 A1 | 1/2004 | Kojovic et al. | |
| 2004/0027748 A1* | 2/2004 | Kojovic et al. | 361/62 |
| 2004/0027750 A1 | 2/2004 | Minami et al. | |
| 2004/0183522 A1 | 9/2004 | Gunn et al. | |
| 2005/0122654 A1 | 6/2005 | Culligan et al. | |
| 2005/0248430 A1 | 11/2005 | Dupraz | |
| 2006/0012374 A1* | 1/2006 | Kojovic et al. | 324/522 |
| 2006/0256488 A1 | 11/2006 | Benzing et al. | |
| 2007/0236208 A1* | 10/2007 | Kojovic et al. | 324/127 |
| 2008/0106253 A1* | 5/2008 | Kojovic | 324/127 |
| 2008/0106254 A1 | 5/2008 | Kojovic et al. | |
| 2008/0154523 A1* | 6/2008 | Gilbert et al. | 702/62 |
| 2009/0147412 A1 | 6/2009 | Kojovic et al. | |
| 2009/0230974 A1* | 9/2009 | Kojovic et al. | 324/522 |
| 2010/0020457 A1* | 1/2010 | Kojovic et al. | 324/127 |

FOREIGN PATENT DOCUMENTS

| | | |
|---|---|---|
| GB | 1 355 827 | 7/1992 |

OTHER PUBLICATIONS

L Kojovic, "Rogowski Coils Suit Relay Protection and Measurement"; Jul. 1997, pp. 47-52.

E. Thuries, et al.; "Contribution of Digital Signal Processing in the Field of Current Transformers"; 1996, pp. 1-11.

P. Mahonen et al., "The Rogowski Coil and the Voltage Divider in Power System Protection and Monitoring"; 1996, pp. 1-7.

G. Schett et al., "The Intelligent GIS-A Fundamental Change in the Combination of Primary and Secondary Equipment", CIGRE, 1996, Switzerland, pp. 1-10.

V. Heumann, "Magnetischer Spannungsmesser Hoher Praazision," Elektrotechnische Zeitschrift Ausgabe A, May 21, 1962, Germany, pp. 349-356.

F. Mekic et al. "Power Transformer Characteristics and Their Effects on Protective Relays", 33$^{rd}$ Western Protective Relay Conference, Oct. 17-19, 2006.

"PCB Rogowski Coils Benefit Relay Protection", by Ljubomir Kojovic, IEEE Computer Applications in Power, ISSN 0895-0156/02, Jul. 2002, 4 pages.

"The Rogowski coil and voltage divider in power system protection and monitoring", Pentti Mähönen and Tapio Hakola, both of Vassa, Finland, as presented in Cigré 34-103, Session 1996; 12 pages.

* cited by examiner

Disclosed Method Minimizing the Noise Level

Disclosed Method of Determining the Noise Level

ROGOWSKI COIL ASSEMBLY AND METHODS

RELATED APPLICATION

This application is a continuation of U.S. patent application No. 11/593,239, entitled "Shielded Rogowski Coil Assembly and Methods," filed Nov. 6, 2006, now U.S. Pat. No. 7,564,233, the complete disclosure of which is hereby fully incorporated herein by reference.

TECHNICAL FIELD

The invention relates generally to electrical power systems, and more specifically to devices for measuring current through an electrical conductor.

BACKGROUND

Rogowski coils provide a reliable means of sensing or measuring current flow at a given point in an electrical system. Current flowing through a conductor generates a magnetic field that, in turn, induces a voltage in the coil. Using the voltage output signal of the coil, actual current conditions in the conductor can be calculated. With the advent of microprocessor-based protection and measurement equipment capable of calculating the current, Rogowski coils are becoming an attractive alternative to conventional current measuring devices.

DETAILED DESCRIPTION OF EXEMPLARY EMBODIMENTS

Electrical generation and power transmission systems typically include a number of protective devices to protect components and equipment from potentially damaging overvoltages and overcurrents. Such protective devices include, among other things, relay devices that open and close portions of the system in response to actual operating conditions. Successful operation of network protection devices in a power distribution system is of course dependent upon accurate sensing and measurement of operating conditions. Microprocessor based equipment, such as digital relay devices, are increasingly being used in electrical power systems, but are prone to inaccurate current measurements due to ambient noise conditions and magnetic fields generated by nearby conductors and equipment. To overcome these and other disadvantages of existing Rogowski coil devices and associated systems, exemplary embodiments of shielded Rogowski coil assemblies and methods for mitigating noise effects are provided according to the present invention.

For a full appreciation of the inventive aspects of exemplary embodiments of the invention described below, the disclosure herein will be segmented into sections. Basic construction and operation of Rogowski coils are first discussed in Part I. Conventional magnetic shielding structures for Rogowski coils will be discussed in Part II. Shielded Rogowski coil assemblies according to the present invention will be discussed in Part III. Algorithms and methods for detecting and minimizing noise in Rogowski coil interfaces are disclosed in Part IV.

I. Introduction to Rogowski Coils

Figure 1:
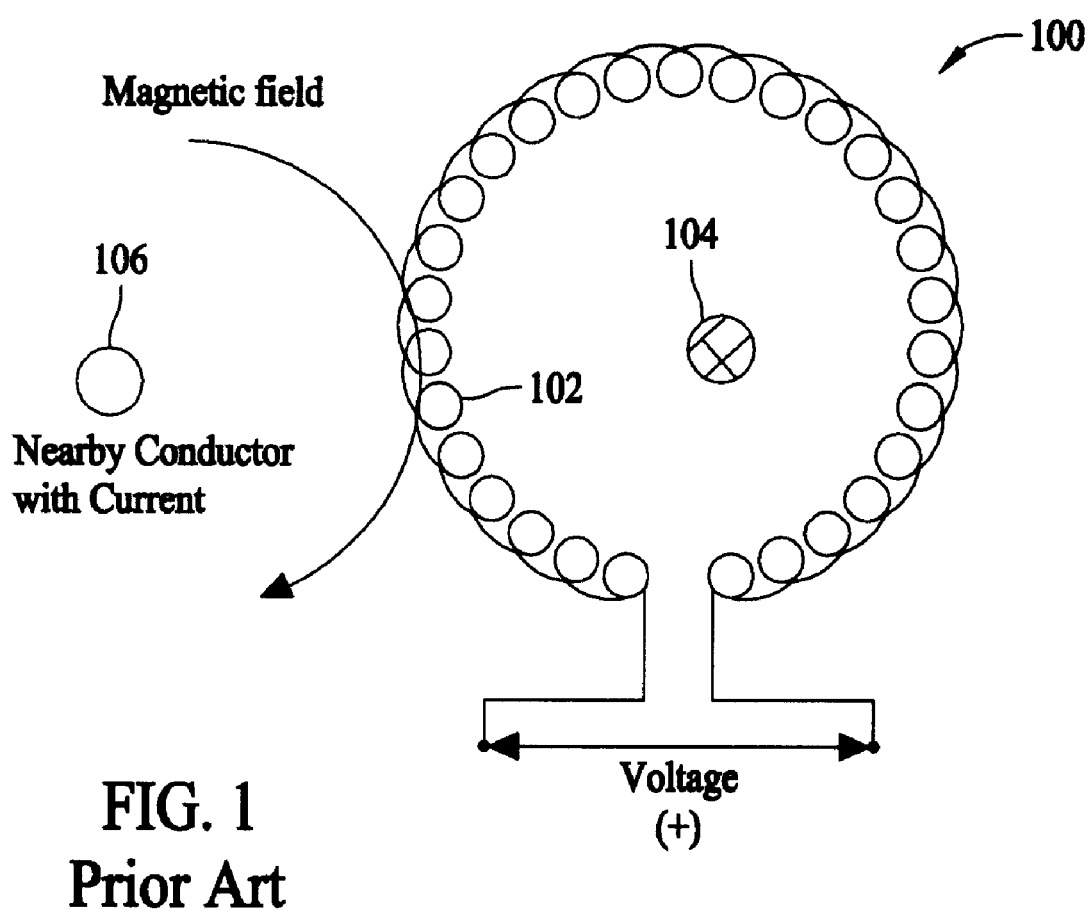
FIG. 1 illustrates principles of operation of a Rogowski coil.

As illustrated in FIG. 1, a Rogowski 100 is generally fabricated from a conductor 102, that may be fabricated from wire, that is coiled or wound on a non-magnetic core, which may be, for example, air or a non-magnetic material. The 102 coil may be placed around a conductor or conductors 104 whose currents are to be measured with the coil 102. A primary current flowing through the conductor 104 generates a magnetic field that, in turn, induces a voltage in the coil 102. A voltage output v(t) of the coil 102 is governed by the following Equation:

$$v(t) = -\mu_o \mu_r nS \frac{di(t)}{dt}$$
$$= -M \frac{di(t)}{dt},$$

where $\mu_o$, is the magnetic permeability of free space, $\mu_r$, is the relative permeability (the ratio of the permeability of the coil 102 to the permeability of free space $\mu_o$), n is the winding density (turns per unit length), S is the cross sectional area of the core in the Rogowski coil, and M represents the mutual reactance or mutual coupling between the coil 102 and the conductor 104.

For an ideal Rogowski coil 102, M is independent of the location of the conductor 104 within the coil 102. As is evident from Equation 1, the Rogowski coil output voltage v(t) is proportional to the rate of change of the measured current i(t) flowing in the conductor 104. The coil output voltage v(t) is therefore typically integrated to determine the current i(t) in the conductor 104.

Figure 2A:
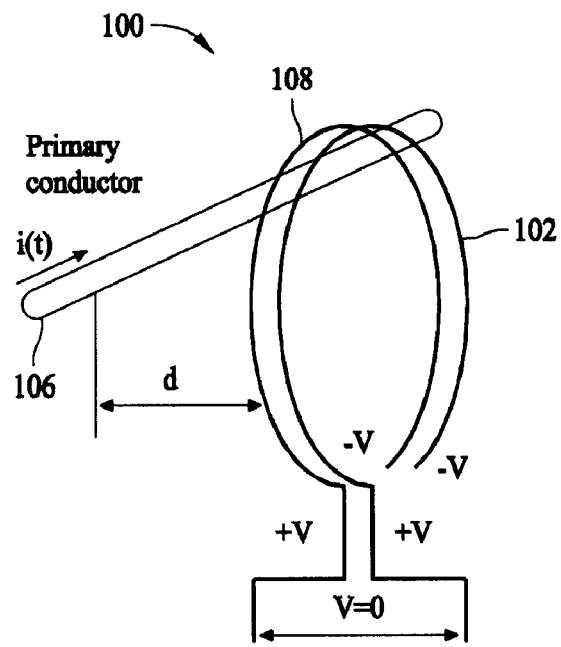
FIGS. 2A and 2B illustrate embodiments of a Rogowski coil with two electrical loops to cancel external magnetic fields.

To prevent undesirable influence of a nearby conductor 106 carrying high currents, the coil 100 may include, as shown in FIG. 2A, first and second wire coils or loops 102, 108 wound in electrically opposite directions. The two coils 102, 108 effectively cancel all electromagnetic fields coming from outside the coil 100. In such an embodiment one or both loops 102, 108 may be fabricated from a wound wire on the core. If only one loop wire wound on a non-magnetic core is utilized, then the other loop may be returned the center of the coil 100 to cancel undesirable effects of external magnetic fields.

Figure 2B:
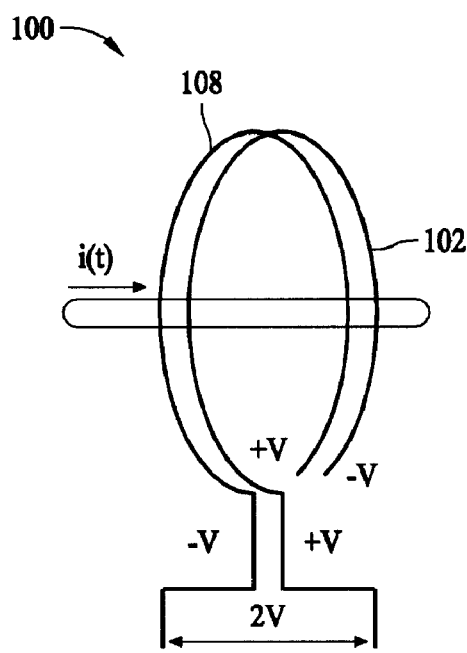

In an embodiment illustrated in FIG. 2B, both loops 102 and 108 may include wound wires, with the second winding 108 being wound in the opposite direction. In this way, the voltage induced in the Rogowski coil 100 from the conductor passing through the coil will be doubled.

Figure 3:
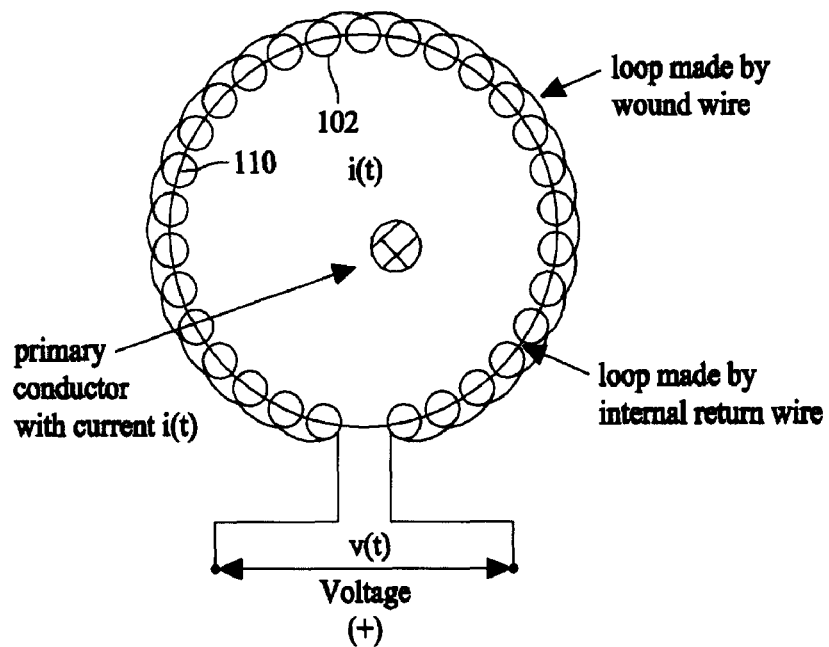
FIG. 3 illustrates one principal of Rogowski coil design.

Conventionally, and as illustrated in FIG. 3, Rogowski coils have been fabricated from flexible, nonmagnetic cores 110 such as cores commonly used in known coaxial cables. Insulating jackets and shielding from such cables, may be stripped to obtain the cores, and after cutting the cable core to size, the coil 102 (and 108) may be wound over the plastic cable core 110. Existing conductors extending through the center of the coaxial cable core 110 may serve as the return loop for cancellation of external magnetic fields as described above. In lieu of such flexible cores 110, high performance Rogowski coils alternatively been fabricated from relatively rigid and straight rods that may be manufactured with a more uniform cross sectional area than the flexible cores. In such a construction, magnetic shielding of the ends of the rods where they connect to one another has been found to be necessary.

U.S. Pat. No. 6,313,623 discloses high-precision Rogowski coil designs of various shapes that are fabricated on printed circuit boards (PCBs), as shown in the coil 150 shown in FIG. 4. In the coil 150, two wound coils 151, 152 are formed on separate PCBs 154, 156 located next to each other. Each PCB 154, 156 defines one of the coils 151 and 152, and the coils 151 and 152 are wound in opposite directions (right-handed and left-handed), respectively. The coil 151 is formed with traces extending on opposing sides of the circuit board 154 interconnected, for example, by plated through-holes, and the coil 151 has a right-handed configuration that progresses in a clockwise direction around the center of the board 154. The left-handed coil 152 is designed in a similar manner on the board 156 except that it has a left-handed configuration that progresses in a counter-clockwise direction around the center of the board 156. The coils 151, 152 may be made on multi-layer PCBs as desired. Further details of such coils and PCBs are described in U.S. Pat. No. 6,313, 623, the disclosure of which is hereby incorporated herein by reference in its entirety.

The Rogowski coils such as those disclosed to U.S. Pat. No. 6,313,623 may be fabricated with a high degree of precision using computer controlled fabrication techniques for forming the coils on the PCBs. Highly sensitive and highly accurate coils for current sensing and measuring applications may therefore be provided. Inaccuracies in the signal output from such coils, however, remains a concern. While the coils on the PCBs are designed to cancel external magnetic fields, the output of the coils have nonetheless been found susceptible to noise, signal distortion and undesirable influences by surrounding conductors and equipment in the vicinity of the coils To address such issues, various shielding features have been proposed for coils with varying degrees of success.

II. Conventional Rogowski Coil Shielding

Figure 5:
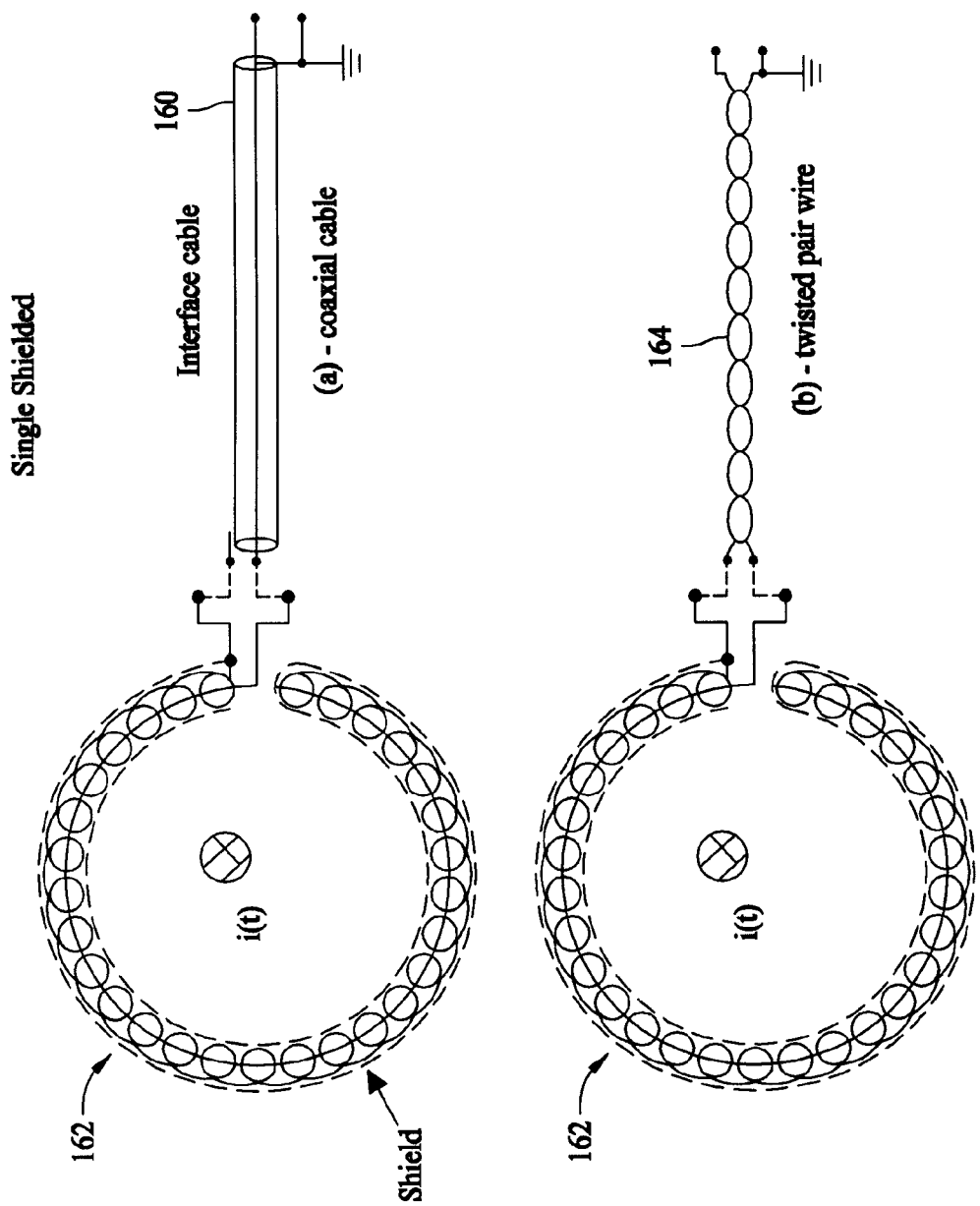
FIGS. 5A and 5B illustrate embodiments of Rogowski coils with conventional shielding.
Figure 6:
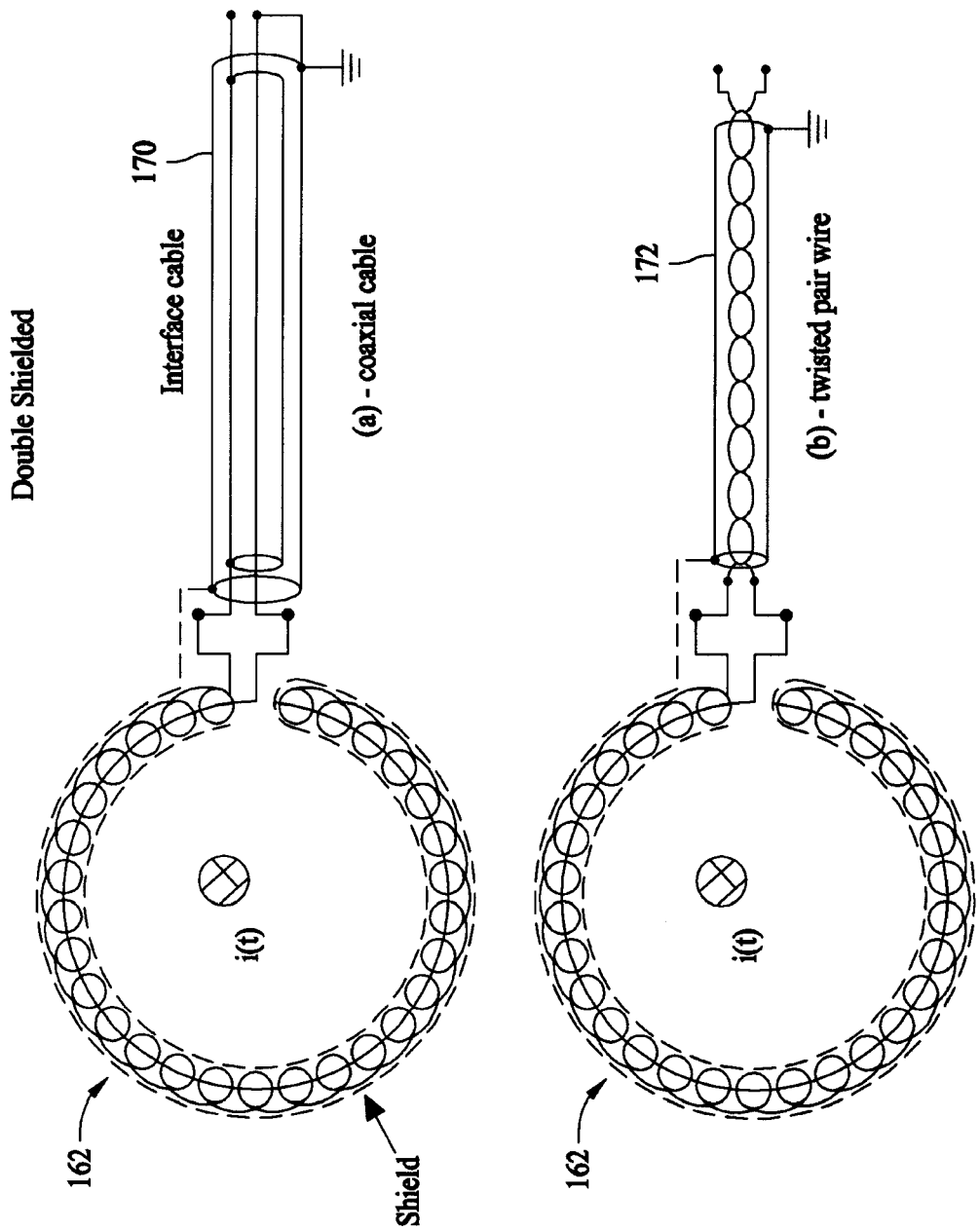
FIGS. 6A and 6B illustrate embodiments of conventional interface shielding for Rogowski coils.

Conventional approaches to shield Rogowski coils and secondary leads interfacing with measuring devices is shown in FIGS. 5A and 5B (single-shielded) and FIGS. 6a and 6b (double-shielded). In FIG. 5A, a shielded coaxial cable 160 is connected to a coil 162. FIG. 5B illustrates a twisted pair wire 164 connected to the coil 162. As is known in the art, the twisted wires carry equal but opposite signals and are less susceptible to noise issues and cross talk issues from adjacent signal conductors. While the shielded cable 160 and the twisted pair wire 164 provide some degree of protection against noise and electromagnetic influences in the environment of the coils 162, the level of protection afforded by them is inadequate for high precision Rogowski coils.

FIGS. 6A and 6B illustrate other conventional approaches for preserving the integrity of the Rogowski coil output signals. FIG. 6A a illustrates a double shielded cable 170 having concentric layers of insulation around the signal conductors in the cable. FIG. 6B illustrates a shielded twisted pair wire 172. While the double shielding features shown in FIGS. 6A and 6B are more effective than the single shielding features shown in FIGS. 5A and 5B, they remain inadequate for some installations of high precision coils.

Figure 4:
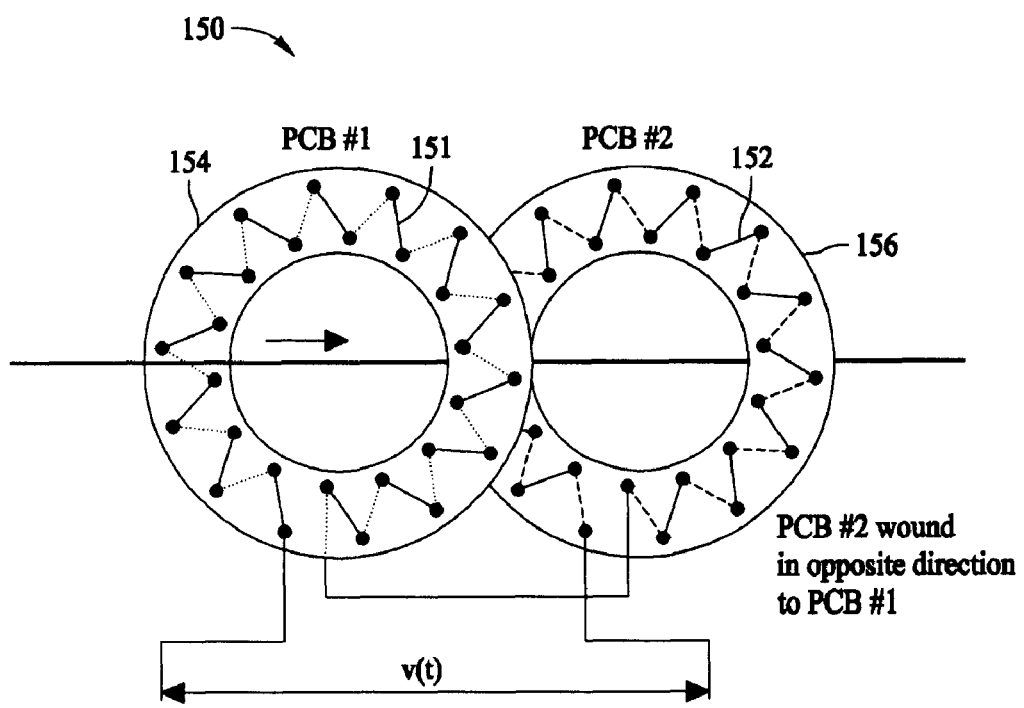
FIG. 4 illustrates a PCB Rogowski coil design.

FIGS. 7A and 7B illustrate high precision coils 180 similar to the coils 150 shown in FIG. 4 that are fabricated from PCB materials. The coils 180 are provided with a protective shield 182 of a non-magnetic material for added isolation of the coils 180 from the ambient environment noise and electromagnetic factors that may distort the output voltage signal. The shielded coils 180 may be interfaced to a measuring device with a shielded coaxial cable 160 (FIG. 7A) or a twisted pair wire 164. A double shielded cable 170 (FIG. 6A) and shielded twisted pair wire 172 (FIG. 6A) may likewise be utilized with the shielded coils 180. Regardless, the shielded cable 160 (or double shielded cable 170) and the twisted pair wire 164 (or shielded twisted wire pair 172) must be terminated to the coil 162 at their ends where they meet the coil 162.

III. Shielded Interface Assemblies

One vulnerability of convention coils lies in the electrical connections and the interfaces between the PCBs of the coil and measuring equipment, such as protective relay devices. That is, while the coils formed on the PCBs are designed to cancel external magnetic fields, the connections of the coils and interfacing wires, conductors, or cables to measuring equipment and devices is susceptible to noise and undesirable influence in the signal from nearby conductors and other magnetic fields present in the vicinity of the coil.

For example, and referring to FIG. 7A, to terminate the cable 160, the shielding of the cable must be partly removed at the end to expose the conductors, and to terminate the twisted pair wire 164 shown in FIG. 7B, the twisted wires must be untwisted at their ends to establish the connection to the coil. In either case, the terminated ends of the cable 160 and the twisted pair wire 164 are generally unprotected and may provide points of ingress for environmental noise and external magnetic fields that may result in inaccuracies in the coil output voltage signal. That is, voltage may be induced at the unprotected termination ends of the cable and the twisted pair wire that may distort the output voltage signal of the shielded coil 182 when received by the measuring device.

Figure 7:
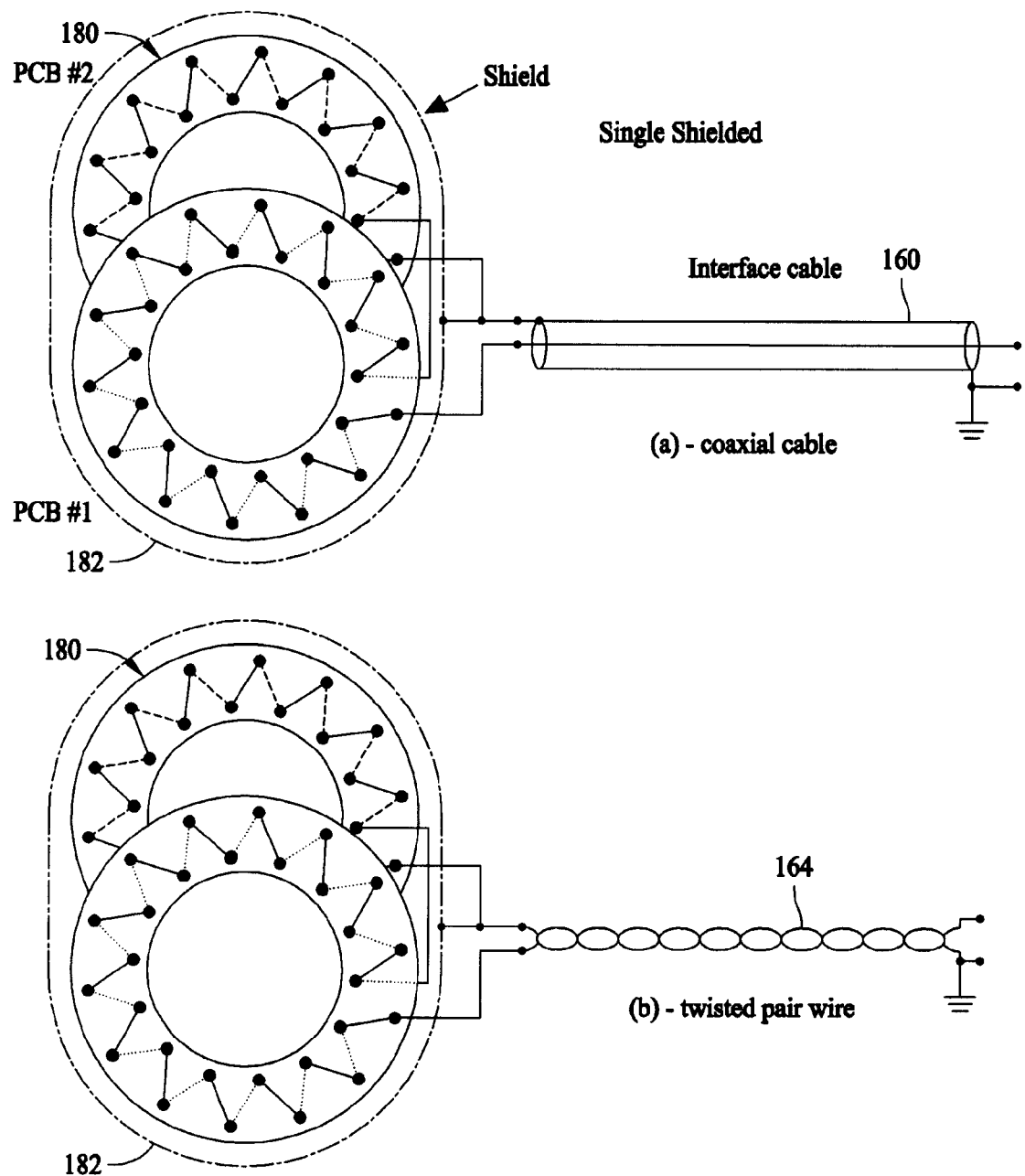
FIGS. 7A and 7B illustrate conventional shielding for Rogowski coils fabricated from printed circuit boards.
Figure 8:
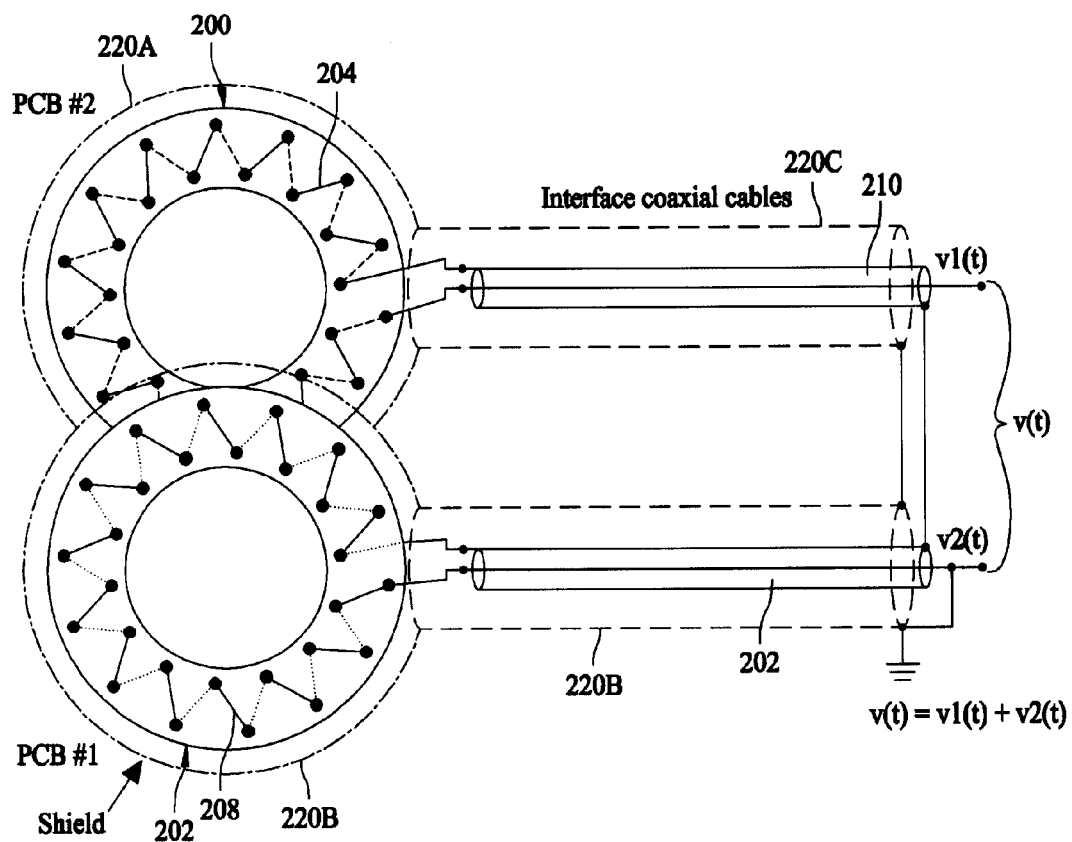
FIG. 8 illustrates a first embodiment of a shielded Rogowski coil assembly according to the present invention.

FIG. 8 illustrates a Rogowski coil assembly according to the present invention wherein first and second PCBs 200 and 202 and respective precision coils 204, 208 are formed in a similar manner to the coils 151, 152 shown in FIG. 4. Unlike the coils 151, 152, that are directly connected in series to one another to produce a single voltage output with a single interface lead, the coils 204 and 208 define separate, independent, and distinct coil loops that each provide a respective output voltage signal $v_1(t)$ and $v_2(t)$. The outputs $v_1(t)$ and $v_2(t)$ may be interfaced with respective shielded cables 210 and 212, In turn, the cables may be connected in series as shown in FIG. 7.

Current measured by the Rogowski coils 200 and 202 will induce voltage in each coil and generate output signals $v_1(t)$ and $v_2(t)$. Because the cables 210 and 212 are connected in series and because the coils 204 and 208 are wound in opposite directions, voltages $v_1(t)$ and $v_2(t)$ add to each other as shown in FIG. 8. In an ideal Rogowski coil, $v_1(t)$ and $v_2(t)$ are equal. In an actual Rogowski coil, due to manufacturing tolerances and production constraints, a slight difference between $v_1(t)$ and $v_2(t)$, may result. If voltages are inducted in the interface cables 210, 212 because of external magnetic fields, the voltages will be induced in each interface cable 210 and 212 in the same direction, but because the two coils are connected in series induced voltages from external fields in the output signal will be canceled.

To address signal integrity issues, each PCB 200 and 202 and each cable 210 and 212 are provided with a respective magnetic shield 220A, 220B, 220C, 220D surrounding the coils 200, 202 and the cables 210 and 212. Consequently, the coils 204 and 208 are doubly protected from induced voltages and noise that are unrelated to current flow in the conductor passing through the coils 204 and 208. The cables 210 and 212 are also protected from induced voltages and noise that are unrelated to the output voltage signals supplied by the coils 200 and 202. The coil shields 220A and 220B are interfitted with the cable shields 220C and 220D so that the terminated ends of the cables 210, 212 are fully protected and shielded from induced voltages that may present errors and inaccuracies in the coil voltage signal outputs, thereby eliminating a point of vulnerability to signal contamination issues in conventional coil assemblies.

The shields 220A, 220B, 220C and 220D may be fabricated from magnetic shielding materials known in the art, including but not limited to silicon steel laminates and the like, to provide electromagnetic shielding and isolation of the coils 204, 208 and associated interface cables 210, 212 from undesirable environmental factors that may otherwise produce noise and inaccuracies in the output signals of the coils 204 and 208. The shielding material 220A, 220B, 220C and 220D may be fabricated as separate pieces that are assembled to the coils 204, 208 and cables 210, 212.

Figure 9:
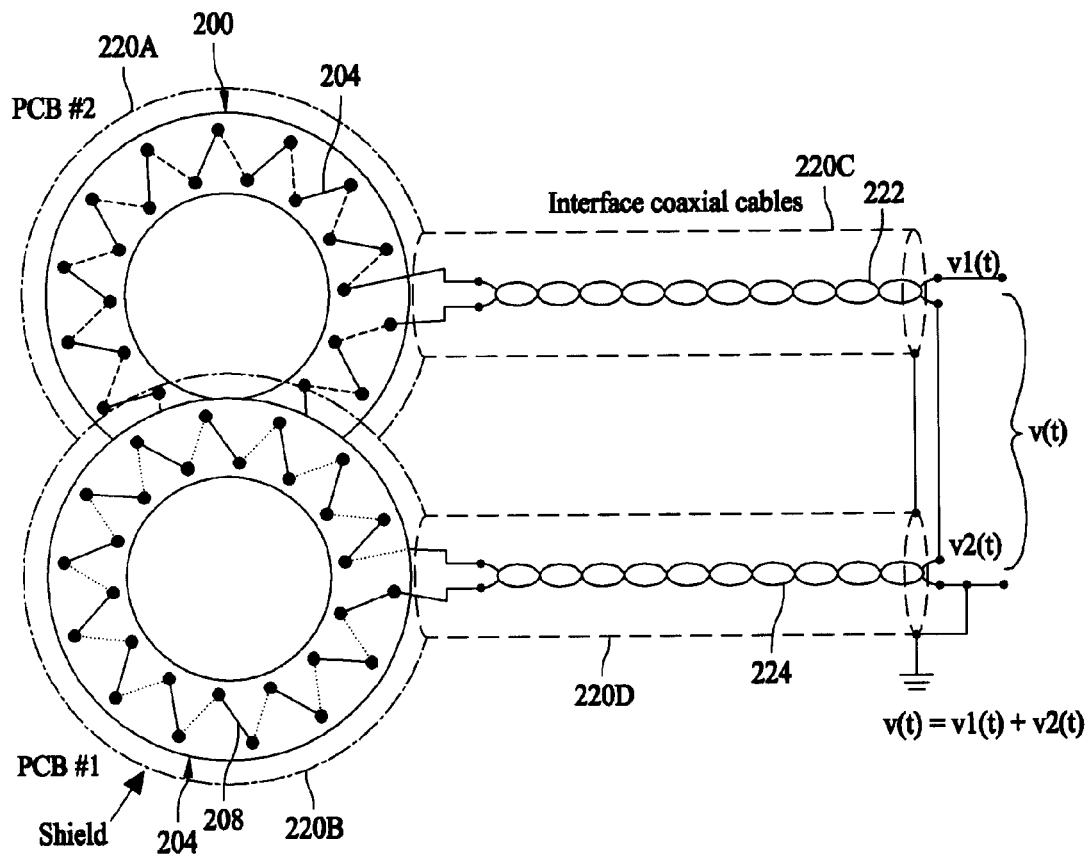
FIG. 9 illustrates a second embodiment of a shielded Rogowski coil assembly according to the present invention.

FIG. 9 illustrates a coil assembly similar to that shown in FIG. 8, but with twisted pair wires 222, 224 utilized within the shielding materials 220C and 220D in lieu of the cables 210 and 212 shown in FIG. 8.

Figure 10:
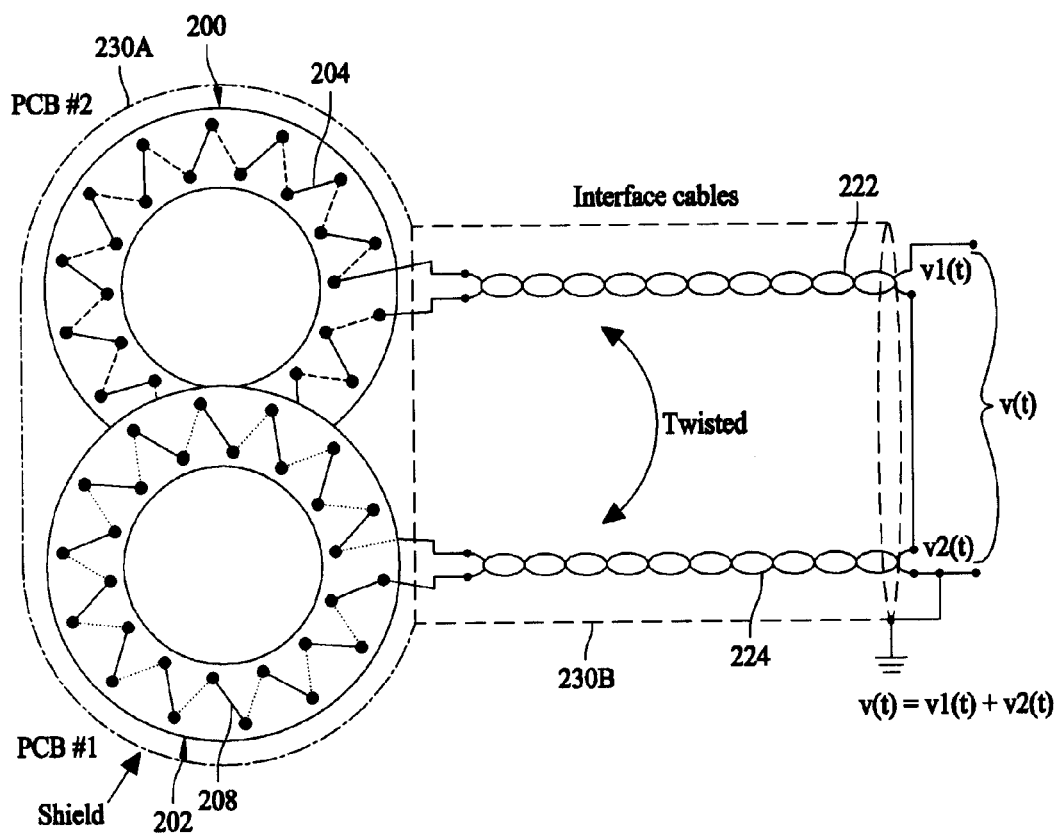
FIG. 10 illustrates a third embodiment of a shielded Rogowski coil assembly according to the present invention.

FIG. 10 illustrates another coil assembly wherein the PCBs 200, 202 and the respective coils 204, 208 are protected into a single shield 230A fabricated from a non-magnetic material. The twisted pair wires 222, 224 are likewise protected by a single shield 230B. The interface shield 230B interfits with the coil shield 230 and surrounds the terminations of the wires 222, 224 to avoid voltages being induced in the terminated ends of the wires 222, 224.

IV. Noise Effect Algorithms

While the shielded coil assemblies shown above in FIGS. 8-10 are believed to be less vulnerable to noise and external magnetic fields than known Rogowski coils, in another aspect of the invention signal processing techniques are provided that allow any noise in the coil output signals to be detected and mitigated. The signal processing techniques, explained briefly below, may be implemented in algorithm form and may be executable by an electronic device interfaced with the coils.

Figure 11:
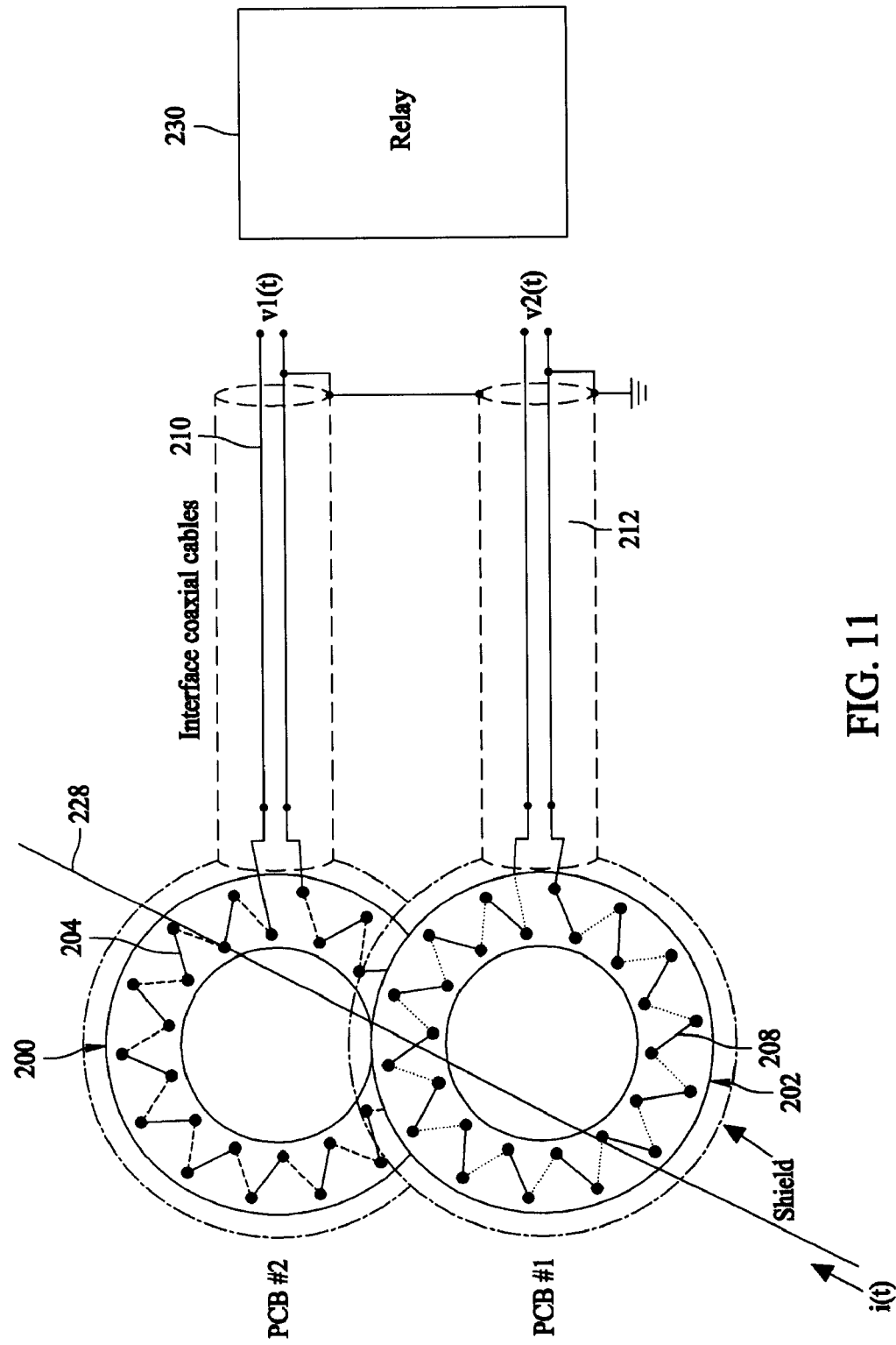
FIG. 11 illustrates a fourth embodiment of a shielded Rogowski coil assembly according to the present invention.

FIG. 11 illustrates an exemplary arrangement of PCB coils 204, 208 being interfaced with a measuring device such as a protective relay 230 monitoring current flow i(t) in a conductor 228 passed through each of the coils 204 and 208. In one embodiment, the relay 230 is a digital processor based device, although it is understood that other known devices may alternatively be used in lieu of a relay 230. Coaxial cables 210 and 212 may be connected to the relay 230 on separate channels thereof as shown in FIG. 11.

Figure 12A:
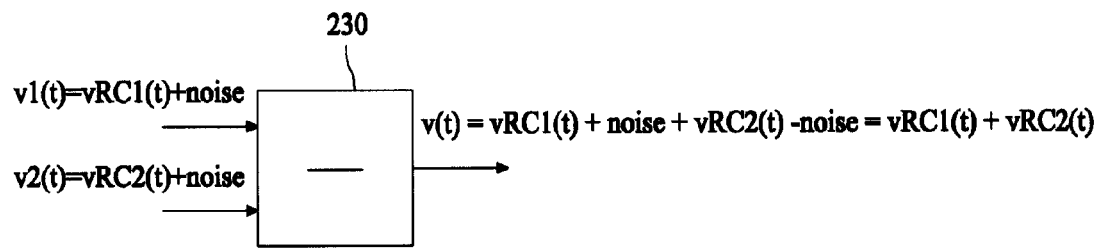
FIG. 12A illustrates a noise effect algorithm for minimizing noise transmission in a Rogowski coil interface.

As shown in FIG. 12A, the coil voltage outputs $v_1(t)$ and $v_2(t)$ that are input into the relay channels are in part true voltage outputs of the Rogowski coils $VRC_1(t)$ and $VRC_2(t)$ and in part are voltages attributable to noise. While the voltage outputs of the coils $RC_1$ and $RC_2$ are of opposite polarity due to the coils being wound in opposite directions, the noise components are not, and consequently by subtracting the voltage input $v_2(t)$ from $v_1(t)$, the noise component is effectively cancelled or eliminated in the resultant output signal v(t) that is the sum of $VRC_1(t)$ and $VRC_2(t)$. It may therefore be ensured that the relay 230 is receiving an accurate signal v(t) from which it may reliably make control decisions, or from which the monitored current may be calculated or otherwise determined, such as via known integration techniques.

Figure 12B:
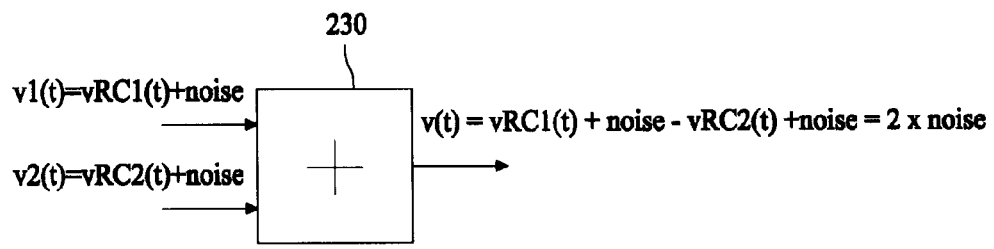
FIG. 12B illustrates a noise effect algorithm for determining noise for a Rogowski coil interface.

As illustrated in FIG. 12B, by summing the coil voltage outputs $v_1(t)$ and $v_2(t)$ that are input into the relay channels, the level of noise in the input signals to the relay may be readily determined and calculated. Because the voltage outputs of the coils $RC_1$ and $RC_2$ are of opposite polarity due to the coils being wound in opposite directions and the noise components are not, when the signals are summed the coil output voltages $VRC_1(t)$ and $VRC_2(t)$ cancel one another and the resultant output value v(t) is substantially entirely noise. Because the noise in each of the interface conductors is added, the output value v(t) is twice the actual noise level. Using event recoding functionality in the relay 230, external noise conditions may be monitored to identify noise issues for resolution.

Still further, utilizing separate secondary interface conductors for each PCB coil facilitates diagnostic functions and features in the relay. If, for example, the coils 204, 208 (FIG. 11) are in satisfactory operating condition, the output voltages of the coils transmitted through the interface conductors should be approximately the same. If, however, one coil has open wires turns or shorted turns, the output voltages of the coils will be markedly different, and the relay 230 may identify a problem in the coil for immediate attention.

Having now explained the operating principles of the invention, it is believed that relay device 230 may be programmed to perform signal processing algorithms to minimize noise effects in the input signals from the Rogowski coils, determine a level of noise in the signals, and perform diagnostic functions and procedures. The algorithms may be implemented using conventional programming techniques that are within the purview of those in the art. Further explanation of associated algorithms, methods and techniques associated with such programming is not believed to be necessary.

One embodiment of a Rogowski coil assembly is disclosed herein which comprises a first Rogowski coil surrounding a conductor and generating a first voltage output signal, and a second Rogowski coil surrounding the conductor and generating a second voltage output signal wherein the first voltage output signal and the second voltage output signal are processed to address noise components in the first and second output voltage signal.

Optionally, each of the first coil portion and the second coil portion may be fabricated on printed circuit boards, and the first and second coils may be electrically connected in opposite directions. First and second interface conductors for the respective first and second coils may be provided, and the first and second conductors may be terminated to the respective coils at one end thereof. The terminations may be magnetically shielded to prevent voltages from being induced in the interface conductors at the terminations. The first and second interface conductors may be surrounded by a common magnetic shield. The conductors may be a coaxial cable or a twisted pair wire and the interface conductors may be connected in series. The first and second interface conductors may be connected to a protective relay device, and the relay device may be programmed to determine a level of noise in the first and second output voltage signal. The relay device may likewise be programmed to cancel noise in the first and second output voltage signal.

An embodiment of a Rogowski coil assembly is also disclosed herein. The assembly comprise a first Rogowski coil comprising a first printed circuit board and a first conductive winding thereon, the first coil surrounding a conductor and generating a first voltage output signal proportional to a rate of change of current flowing through the conductor. A second Rogowski coil is also provided and comprises a second printed circuit board and a second conductive winding thereon, the second coil surrounding the conductor and generating a second voltage output signal proportional to the rate of change of current flowing through the conductor. A pair of interface conductors are also provided, with each of the pair of interface conductors transmitting one of the first and second voltage output signals.

Optionally, the first and second coils extend in opposite directions. Each of the first and second conductors are terminated to the respective first and second coils, and the terminated conductors are magnetically shielded to prevent voltages from being induced in the interface conductors at the termination locations. The first and second interface conductors may be surrounded by a common magnetic shield. At least one of the first and second interface conductors may be a coaxial cable or a twisted pair wire. The first and second interface conductors are connected in series. A microprocessor based device may be connected to each of the first and second interface conductors, and the microprocessor based device may be programmed to determine a level of noise in first and second output voltage signal. The microprocessor based device may also be programmed to cancel noise in first and second output voltage signal.

An embodiment of a Rogowski coil system is also disclosed herein. The system comprises a conductor and a first Rogowski coil comprising a conductive circuit board and a right handed coil formed thereon, the right handed coil receiving the conductor generating a first voltage output when the conductor is energized. A second Rogowski coil comprises a conductive circuit board and a left handed coil formed thereon, the left-handed coil receiving the conductor and generating a generating a second voltage output when an energized conductor is passed through the coil. A first interface conductor is terminated to the first coil and a second interface conductor, separately provided form the first interface conductor, is terminated to the second coil.

Optionally, magnetic shields protecting an area of termination of the respective interface conductors to each of the first and second coils. The first and second interface conductors may be surrounded by a common magnetic shield. The interface conductors may be selected from the group of a coaxial cable, a twisted pair wire, and combinations thereof. The first and second interface conductors may be connected in series. A microprocessor based device may be connected to each of the first and second interface conductors, and the microprocessor based device may be programmed to determine a level of noise in first and second output voltage signal. The microprocessor based device may be programmed to cancel noise in first and second output voltage signal.

A method of monitoring current with a Rogowski coil assembly is also disclosed. The method comprises providing a first Rogowski coil having a first winding; providing a second Rogowski coil having a first winding extending opposite to the first winding; connecting an interface conductor to each of the first and second coils; obtaining distinct voltage outputs from each of the first and second Rogowski coils; and applying a noise effect algorithm, using a microprocessor based device, to the voltage outputs.

Optionally, the method may also comprise applying a noise effect algorithm comprises determining an amount of noise in the voltage outputs, which may comprises adding the voltage outputs conducted through the first and second interface conductor. The noise effect algorithm may also comprise minimizing an amount of noise in the voltage outputs, and minimizing an amount of noise in the voltage outputs may comprise subtracting the voltage outputs conducted through the first and second interface conductor.

An embodiment of a Rogowski coil system is also disclosed. The system comprises first and second sensing coils formed on respective circuit boards and configured for induced voltage measurements corresponding to current flow in a conductor passing through the coil; and means for monitoring noise conditions during operation of the coils.

The system may also comprise means for shielding the first and second sensing coils. Means for interfacing the first and second sensing coils with the means for monitoring may also be provided. Means for shielding the connection of the means for interfacing with the means for monitoring may also be provided.

While the invention has been described in terms of various specific embodiments, those skilled in the art will recognize that the invention can be practiced with modification within the spirit and scope of the claims.

What is claimed is:

1. A Rogowski coil assembly, comprising:
   a first Rogowski coil surrounding a conductor and generating a first voltage output signal;
   a second Rogowski coil surrounding the conductor and generating a second voltage output signal; and
   a relay device interfaced with the first and second Rogowski coils and programmed to process the first voltage output signal and the second voltage output signal to calculate a level of noise in the first and second output voltage signals, wherein the relay device is further programmed to process the first output signal and the second voltage output signal to minimize the level of noise in the first and second output voltage signals.

2. The Rogowski coil assembly of claim 1, wherein each of the first Rogowski coil and the second Rogowski coil is fabricated on a printed circuit board.

3. The Rogowski coil assembly of claim 1, wherein the first and second Rogowski coils are electrically connected in opposite directions.

4. The Rogowski coil assembly of claim 1, further comprising first and second interface cables, each of the first and second interface cables being coupled to one of the first and second coils, each of the first and second interface cables being terminated to its respective coil at one end thereof, each termination of the first and second interface cables being separately magnetically shielded to prevent voltages from being induced in the interface cables at the terminations.

5. The Rogowski coil assembly of claim 1, further comprising first and second interface cables, each of the first and second interface cables being coupled to one of the first and second coils, the first and second interface cables being surrounded by a common magnetic shield.

6. The Rogowski coil assembly of claim 1, further comprising first and second interface cables, each of the first and second interface cables being coupled to one of the first and second coils, at least one of the cables comprising a coaxial cable.

7. The Rogowski coil assembly of claim 1, further comprising first and second interface cables for the respective first and second coils, at least one of the cables comprising a twisted pair wire.

8. The Rogowski coil assembly of claim 1, further comprising first and second interface cables for the respective first and second coils, the interface cables being connected in series.

9. The Rogowski coil assembly of claim 1, further comprising first and second interface cables coupling the respective first and second coils to the relay device.

10. A Rogowski coil assembly, comprising:
   a first Rogowski coil surrounding a conductor and generating a first voltage output signal;
   a second Rogowski coil surrounding the conductor and generating a second voltage output signal; and
   a relay device interfaced with the first and second Rogowski coils and programmed to process the first voltage output signal and the second voltage output signal to minimize an amount of noise in the first and second output voltage signals.

11. The Rogowski coil assembly of claim 10, wherein the relay device is further programmed to process the first output signal and the second voltage output signal to calculate the amount of noise in the first and second output voltage signals.

12. The Rogowski coil assembly of claim 10, wherein each of the first Rogowski coil and the second Rogowski coil is fabricated on a printed circuit board.

13. The Rogowski coil assembly of claim 10, wherein the first and second Rogowski coils are electrically connected in opposite directions.

14. The Rogowski coil assembly of claim 10, further comprising first and second interface cables, each of the first and second interface cables being coupled to one of the first and second coils, each of the first and second interface cables being terminated to its respective coil at one end thereof, each termination of the first and second interface cables being separately magnetically shielded to prevent voltages from being induced in the interface cables at the terminations.

15. The Rogowski coil assembly of claim 11, further comprising first and second interface cables, each of the first and second interface cables being coupled to one of the first and second coils, the first and second interface cables being surrounded by a common magnetic shield.

16. The Rogowski coil assembly of claim 10, further comprising first and second interface cables, each of the first and second interface cables being coupled to one of the first and second coils, at least one of the cables comprising a coaxial cable.

17. The Rogowski coil assembly of claim 10, further comprising first and second interface cables for the respective first and second coils, at least one of the cables comprising a twisted pair wire.

18. The Rogowski coil assembly of claim 10, further comprising first and second interface cables for the respective first and second coils, the interface cables being connected in series.

19. The Rogowski coil assembly of claim 10, further comprising first and second interface cables coupling the respective first and second coils to the relay device.

20. A method of monitoring current with a Rogowski coil assembly, the method comprising the steps of:
   providing a first Rogowski coil comprising a first winding;
   providing a second Rogowski coil comprising a second winding extending opposite to the first winding;
   connecting an interface cable to each of the first and second Rogowski coils;
   obtaining distinct voltage outputs from each of the first and second Rogowski coils, via the interface cables; and
   minimizing an amount of noise in the voltage outputs by using a microprocessor based device to apply a noise effect algorithm to the voltage outputs.

* * * * *